US008130019B1

(12) United States Patent
Awad et al.

(10) Patent No.: US 8,130,019 B1
(45) Date of Patent: Mar. 6, 2012

(54) CLOCK SIGNAL PROPAGATION METHOD FOR INTEGRATED CIRCUITS (ICS) AND INTEGRATED CIRCUIT MAKING USE OF SAME

(75) Inventors: Tom Awad, Montreal (CA); Martin Laurence, Montreal (CA); Martin Filteau, Laval (CA); Pascal Gervais, Montreal (CA); Douglas Morrissey, Montreal (CA)

(73) Assignee: Octasic Inc., Montreal, Quebec (CA)

( * ) Notice: Subject to any disclaimer, the term of this patent is extended or adjusted under 35 U.S.C. 154(b) by 57 days.

(21) Appl. No.: 12/579,560

(22) Filed: Oct. 15, 2009

Related U.S. Application Data

(60) Provisional application No. 61/105,675, filed on Oct. 15, 2008.

(51) Int. Cl.
  *G06F 1/04* (2006.01)
  *H03K 3/00* (2006.01)
(52) U.S. Cl. ...................................................... 327/291
(58) Field of Classification Search .................. 326/93
  See application file for complete search history.

(56) References Cited

U.S. PATENT DOCUMENTS 6,064,232 A * 5/2000 Relph .............................. 326/93
7,417,993 B1 8/2008 Ebergen et al.

OTHER PUBLICATIONS

Mike Stein; "Crossing the abyss: asynchronous signals in a synchronous world", www.edn.com, Jul. 24, 2003, pp. 59,60,62,64,66,68,69.
Octasic; "Octasic Announces High Performance Asynchronous DSP Core", Press Release, Montreal, Quebec, Canada, Oct. 16, 2007, http://www.octasic.com/en/about/news.php?yr=2007&pr=50, 2 pages.

* cited by examiner

*Primary Examiner* — Lincoln Donovan
*Assistant Examiner* — Daniel Rojas
(74) *Attorney, Agent, or Firm* — Ladas & Parry LLP

(57) ABSTRACT

A method is provided for propagating clock signals in a circuit segment having a first clocked device, a second clocked device and a data path between the first clocked device and the second clocked device. The data path propagates data released by the first clocked device to the second clocked device and is associated with a data propagation delay. The method comprises providing a clock propagation path for propagating clock signals to the first clocked device and the second clocked device, wherein the clock signal propagated to the second clocked device is delayed from the clock signal propagated to the first clocked device by a clock delay interval, the clock delay interval being related to the data propagation delay of the data path. A circuit segment making use of the above method is also provided.

28 Claims, 9 Drawing Sheets

CLOCK SIGNAL PROPAGATION METHOD FOR INTEGRATED CIRCUITS (ICS) AND INTEGRATED CIRCUIT MAKING USE OF SAME

CROSS-REFERENCE TO RELATED APPLICATION

The present application claims the benefit of priority under 35 USC §119 e) based on U.S. provisional patent application Ser. No. 61/105,675 filed on Oct. 15, 2008 by T. Awad et al. The contents of the aforementioned document are incorporated herein by reference.

FIELD OF THE INVENTION

The present invention relates generally to the field of semiconductors, and, more specifically, to a method for use in IC, ASIC, FPGA designs for propagating clock signals.

BACKGROUND

When designing synchronous digital circuits, logic functions are implemented and connected together to form a complete and functioning design. The precise timing of events in synchronous digital circuits is controlled by so-called clock signals. The task of the clock signals is to reduce the uncertainty in delay between sending and receiving storage elements. Storage elements such as latches and flip-flops, respond to a predefined characteristic of a clock signal (e.g., a leading and/or trailing edge of the clock signal) by sampling output signals supplied by combinational logic or other storage elements. The sampled value is internally preserved by the storage element as the state of the circuit. The state of the storage element is made available for new computations after a certain delay. These storage elements are also referred to as clocked devices because they are responsive to clock signals in order to alter their state.

Synchronization requires that data arrive at a clocked device, such as a flip-flop, at an appropriate time relative to a clock signal pulse. There is a specified "setup time" and "hold time" for any clocked device. Setup time requires that input data must be present at the data input lead of clocked device and be in stable form for a predetermined amount of time before the clock signal transition (rising or falling edge of the clock signal). Hold time requires that, for proper operation, the data be stable from the time of the clock signal transition up to a certain time interval after the clock signal transition. When implementing a circuit containing thousands of clocked devices, any violation of the stringent hold time or setup time parameters would prevent proper operation of the implemented circuit. A key process in implementing a logic circuit is to synchronize the setup and hold time of data with the arrival of a corresponding clock signal.

Commonly, setup time violations can be remedied by slowing down the speed at which the design is clocked. A deficiency of such an approach is that the maximum frequency of the clock, and hence the performance of the overall circuit, is dictated by the slowest stage of logic through the circuit.

Hold time violations, however, typically persist regardless of the speed of the clock signal and depend on the clock skew in various parts of the circuit design. As a clock signal traverses different branches of a tree-like distribution network, its critical component (e.g., a leading clock edge) may arrive at different storage elements at different times. This timing difference between clock arrival times at different points in the digital circuit is called clock skew. Clock skew may be attributed to, for example, component elements not being perfectly matched throughout the chip or to a drop in the power supply at one location of the chip and not at another, which would cause a difference in delay in signal propagation. Therefore, in implementing a circuit, the proper timing of clock signals may be hindered due to excessive delay in the clock signal distribution paths by reason of clock skew.

Regardless of the reason for the presence of clock skew, the effect on the functionality of an integrated circuit is significant. Clock skew may cause data in a first clocked device to shift earlier than data in a second subsequent clocked device. The hold time requirement of the second clocked device is violated and data bits may then be lost. This situation is commonly referred to as a "race condition".

Current design tools for integrated circuits do not accurately model the phenomenon of clock skew since the latter is due in part to the physical properties of the material with which the integrated circuit is built. Moreover, the physical properties of the manufactured material may vary from one integrated circuit to the other. As a result, producing an accurate model for all integrated circuits is prohibitively complex if not impossible. When hold-time violations occur post-fabrication of an integrated circuit design, it may only affect a portion of the total manufactured devices causing them to be non-functional. This results in either a lower yield of the manufacturing process or the integrated circuit must be redesigned and rebuilt to account for clock skew. A lower yield results in a higher cost of obtaining functional devices, while the redesigning and rebuilding process often results in significant delays in launching a new integrated circuit on the market. Both lower yield and/or redesign result in lost revenues and in an increase in manufacturing costs.

A current approach to overcome the problem of hold time violations is to purposefully introduce delays in the integrated circuit to compensate for potential foreseen hold time violations. This introduction of delays can have a significant impact on the performance of the resulting integrated circuit, in particular if a very conservative approach is used and more delays then strictly required are included in the integrated circuit. However, if insufficient delays are introduced with the goal of improving performance, hold time violations may remain in the circuit post-fabrication and the result is a non-functional integrated circuit due in part to the presence of race conditions.

Another deficiency with currently used approaches is that they provide no suitable solutions for addressing the presence of hold time violations post-fabrication.

Another deficiency associated with circuits in which the components operate in accordance with a common global clock is that there are sudden surges in power consumption each time a clock transition causes a change of state in the clocked components. Consequently, power sources powerful enough to supply power during these sudden surges must be used to operate devices making use of such circuits even though the average power consumption of the circuit may be significantly less.

In light of the above, it appears that there is a need in the industry for providing a clock propagation circuit and a method for propagating clock signals that alleviate at least in part the deficiencies of the prior art.

SUMMARY

In accordance with a broad aspect, the invention provides a circuit segment comprising a first clocked device, a second clocked device and a data path between the first clocked device and the second clocked device. The data path is for propagating data released by the first clocked device to the second clocked device and is associated with a data propagation delay. The circuit segment also comprises a clock propagation path for propagating clock signals to the first clocked device and to the second clocked device. The clock signal propagated to the second clocked device is delayed from the clock signal propagated to the first clocked device by a clock delay interval related to the data propagation delay of the data path.

In accordance with a specific example of implementation, the clock delay interval is at least as long as the data propagation delay of the data path between the first clocked device and the second clocked device.

In accordance with a specific example of implementation, the clock signal propagated to the first clocked device is a first clock signal and the clock signal propagated to the second clocked device is a second clock signal. The clock propagation path includes clock delay logic for obtaining the second clock signal by delaying the first clock signal by the clock delay interval. Any suitable circuit components may be used to implement the clock delay logic. In a specific implementation, the clock delay logic includes:
  a) an input for receiving the first clock signal;
  b) a delay circuit for delaying the first clock signal by the clock delay interval to obtain a delayed version of the first clock signal;
  c) an output for releasing the delayed version of the first clock signal as the second clock signal.

In a variant, the clock delay interval is a selectable parameter. In this variant, the clock delay logic may comprise:
  a) a delay circuit for generating a plurality of delayed versions of the first clock signal, each delayed version being associated with a respective clock delay interval in a set of possible clock delay intervals;
  b) a clock delay interval selection module responsive to a control signal for selecting a delayed version of the first clock signal amongst the plurality of delayed versions of the first clock signal;
  c) an output for releasing the delayed version of the first clock signal selected by the clock delay interval selection module as the second clock signal.

Optionally, the clock delay interval selection module allows adjusting the delay interval used in generating the second clock signal so that it may be modified at different stages of the creation of a circuit incorporating the circuit segment described above such as:
  during the design of the circuit incorporating the circuit segment;
  during the manufacturing of the circuit incorporating the circuit segment;
  post-fabrication of the circuit incorporating the circuit segment.

In accordance with a specific example of implementation, the data path between the first clocked device and the second clocked device includes:
  a) a plurality of data sub-paths between the first clocked device and the second clocked device for propagating data released by the first clocked device to the second clocked device, each of said data sub-paths being associated with a respective sub-path data propagation delay, said plurality of data sub-paths including:
    i. a slow data sub-path associated with a slow sub-path data propagation delay;
    ii. a fast data sub-path associated with a fast sub-path data propagation delay;
  b) wherein the data propagation delay of the data path corresponds to the slow sub-path propagation delay.

In accordance with a specific example of implementation, the clock signal propagated to the first clocked device includes a plurality of clock events and is characterized in that a time period between two consecutive clock events is related to the fast sub-path propagation delay.

In accordance with another broad aspect, the invention provides a circuit comprising a plurality of circuit segments of the type described above. In accordance with a specific example of implementation, the circuit segments are associated with respective clock delay intervals, the clock delay intervals being independent from one another. In a specific example, each circuit segment delays a clock signal that it receives by a respective clock delay interval related to a propagation delay of a data path in the circuit segment.

In accordance with another broad aspect, the invention provides a method for propagating clock signals in a circuit segment having a first clocked device, a second clocked device and a data path between the first clocked device and the second clocked device. The data path propagates data released by the first clocked device to the second clocked device and is associated with a data propagation delay. The method comprises providing a clock propagation path for propagating clock signals to the first clocked device and to the second clocked device, wherein the clock signal propagated to the second clocked device is delayed from the clock signal propagated to the first clocked device by a clock delay interval related to the data propagation delay of the data path.

In accordance with a specific example of implementation, the clock delay interval is at least as long as the data propagation delay of the data path.

In accordance with a specific example of implementation, the clock signal propagated to the first clocked device is a first clock signal and the clock signal propagated to the second clocked device is a second clock signal. The method includes delaying the first clock signal by the clock delay interval in order to obtain the second clock signal.

In accordance with a variant of the invention, the method comprises generating a plurality of delayed versions of the first clock signal, each delayed version being associated with a respective clock delay interval in a set of possible clock delay intervals. The method also comprises selecting a delayed version of the first clock signal amongst the plurality of delayed versions of the first clock signal and using the selected delayed version of the first clock signal as the second clock signal.

Advantageously, a circuit comprising one or more circuit segments of the type described above may make use of timing information associated with individual circuit segments to reduce some of the issues surrounding clock distribution and clock skew associated with traditional synchronous designs.

These and other aspects and features of the present invention will now become apparent to those of ordinary skill in the art upon review of the following description of specific embodiments of the invention in conjunction with the accompanying drawings.

BRIEF DESCRIPTION OF THE DRAWINGS

In the accompanying drawings.

Other aspects and features of the present invention will become apparent to those ordinarily skilled in the art upon review of the following description of specific embodiments of the invention in conjunction with the accompanying Figures.

DETAILED DESCRIPTION

Examples of implementations will now be described with reference to the Figures. For the purpose of simplicity, components and processes not necessary to convey the principles of the invention have been omitted from the Figures. The person skilled in the art will readily appreciate that practical implementations making use of the concepts presented in the present description will include several other components and implement several other processes and that the inclusion of such components and processes in variants of the invention does not detract from its spirit. Since such components and processes are not necessary for the understanding of the present invention, they will not be described in further detail in the present document.

Although the term "clock signal" is traditionally used to refer to a pulse train having a uniform frequency, for the purpose of the present description the term "clock signal" is used to refer to any reference signal used for the purpose of causing a clocked circuit device to alter its state. Clocked devices generally respond to a predefined characteristic or event of a reference signal such as a rising (or leader) edge, a falling (or trailing) edge or both edges, in order to alter their state. As such, the term "clock signal" is used to refer to a reference signal having a series of rising and falling edges where the rising and falling edges occur at a uniform frequency or at variable frequencies.

Figure 1:
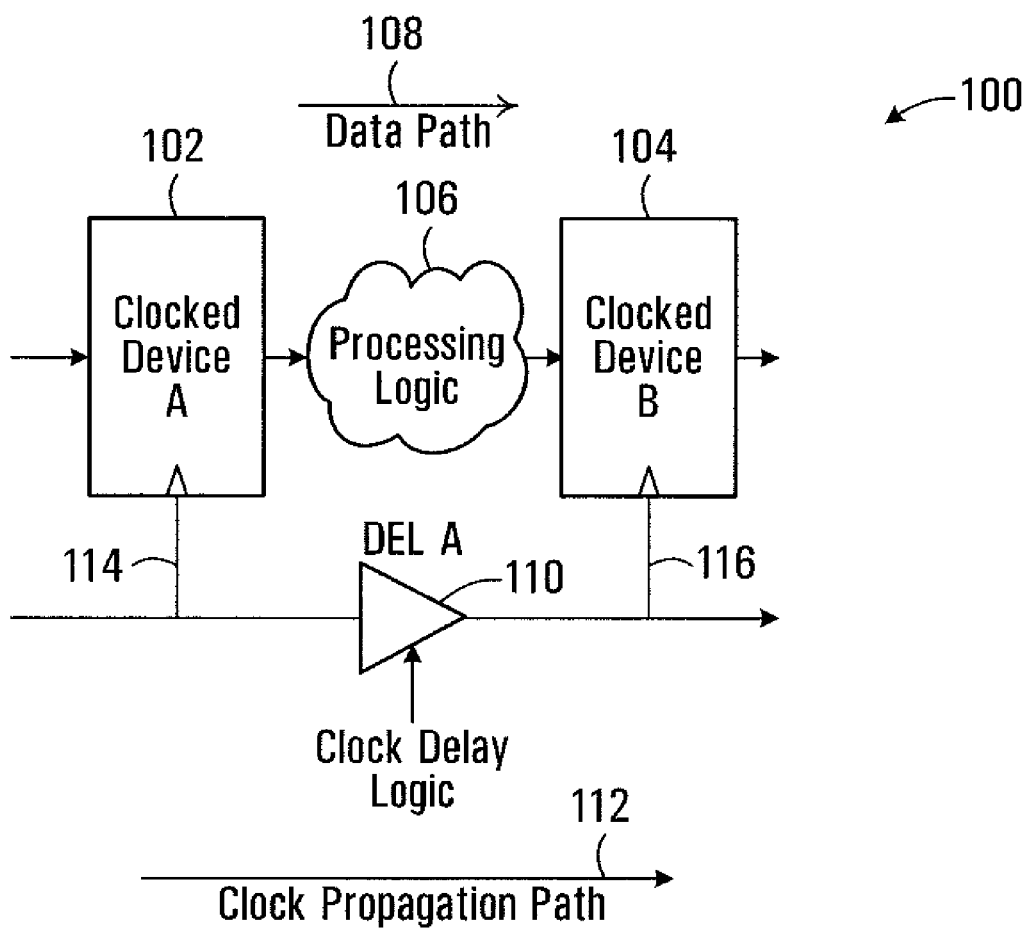
FIG. 1 shows a block diagram of an exemplary circuit segment in accordance with a specific example of implementation of the present invention.

With reference to FIG. 1, there is shown a block diagram of a circuit segment 100 in accordance with a specific example of implementation of the present invention. As depicted, the circuit segment 100 includes a first clocked device 102, a second clocked device 104, a data path 108 between the first clocked device 102 and the second clocked device 104 and a clock propagation path 112.

First and Second Clocked Devices 102 and 104

The first and second clocked devices 102 and 104 may be embodied as any suitable circuit devices that are responsive to clock signals in order to alter their state and may include any number of input and output data lines. Examples of such circuit devices include latches and flip-flops.

Data Path 108

The data path 108 propagates data released by the first clocked device 102 to the second clocked device 108.

The data path 108 includes processing logic 106 which may include any number of electronic components, such as logic gates for examples, which manipulate the data released by the first clocked device 102. The specific nature of the processing logic 106 and the functions it implements are not critical to the invention and therefore will not be described further here. It is however to be appreciated that the data released by the first clocked device 102 takes a certain amount of time to propagate through the processing logic 106 to reach the second clocked device 104. This amount of time required to data to propagate through the processing logic 106 is referred to as the propagation delay of data path 108.

The person skilled in the art will appreciate that, in certain embodiments, the processing logic 106 may be such that the data path 108 may include a plurality of data sub-paths between the first clocked device 102 and the second clocked device 104, wherein each data sub-path propagates at least a portion of the data released by the first clocked device 102 to the second clocked device 104. Each of the data sub-paths may include any number of electronic components, such as logic gates for examples, which manipulate the data released by the first clocked device 102. It will be appreciated that the time taken for data to propagate from the first clocked device 102 to the second clocked device 104 may vary depending on the data sub-path taken. As such, each data sub-path is associated with a respective sub-path data propagation delay.

Figure 2A:
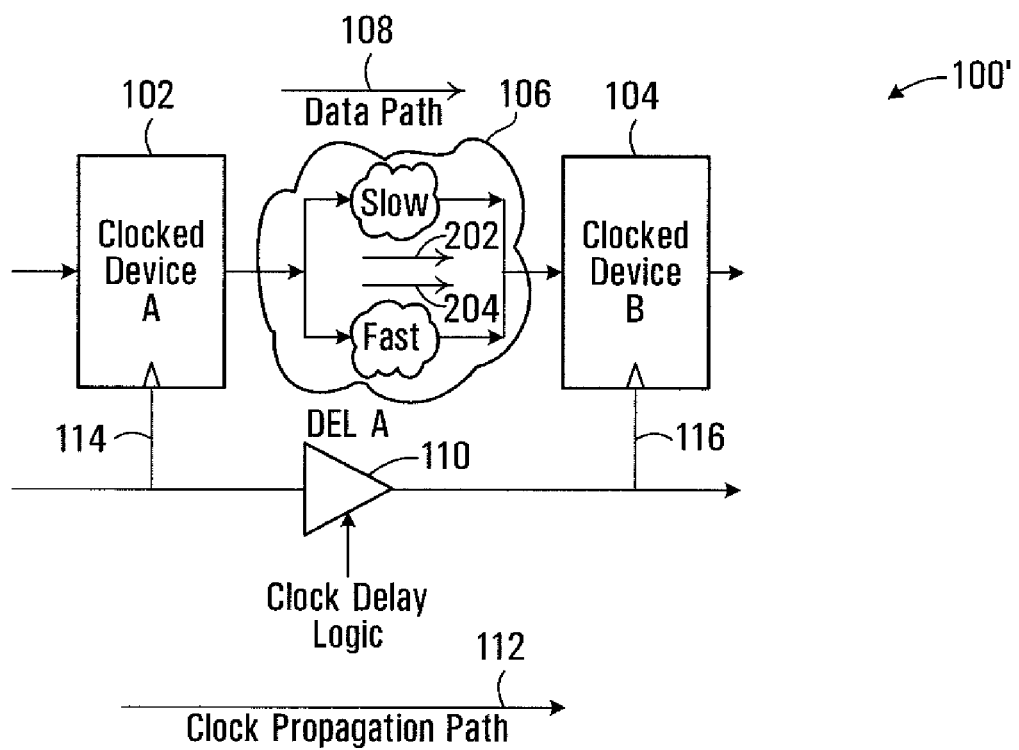
FIG. 2A shows a block diagram of an exemplary circuit segment in accordance with another specific example of implementation of the present invention.

An example of such an embodiment is illustrated in FIG. 2A. In the example shown, two data sub-paths 202 204 are illustrated, namely a slow data sub-path 202 and a fast data sub-path 204. It will be appreciated that many other sub-paths may be present in processing logic 106 but these have been omitted from the Figure for the purpose of simplicity.

The slow data sub-path 202 is the sub-path in the data path 108 that has the longest (slowest) propagation delay. In other words, the sub-path propagation delay of the slow data sub-path 202, herein referred to as the slow sub-path data propagation delay, is at least as long as the sub-path data propagation delays of each of the other data sub-paths part of data path 108.

The fast data sub-path 204 is the sub-path in the data path 108 that has the shortest (fastest) propagation delay. In other words, the sub-path propagation delay of the fast data sub-path 204, herein referred to as the fast sub-path data propagation delay, is at least as short as the sub-path data propagation delays of each of the other data sub-paths part of data path 108.

In such implementations, the data propagation delay of data path 108 is the time taken for all data propagating through processing logic 106 to arrive at the second clocked device 104. As such the data propagation delay of data path 108 corresponds to the sub-path propagation delay associated with the slow data-path 202.

Optionally, data path 108 may be comprised of multiple logical data paths that may be selected on the basis of a control signal which may vary from one clock event to the next.

Figure 2B:
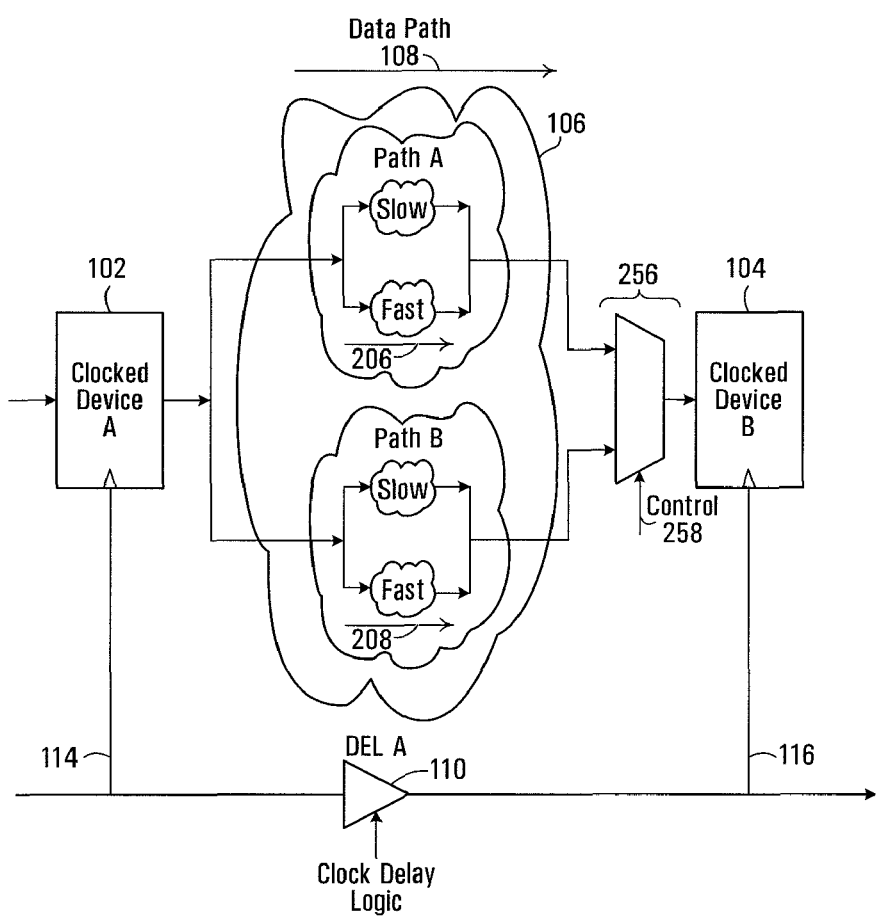
FIG. 2B shows a block diagram of an exemplary circuit segment in accordance with yet another specific example of implementation of the present invention.

An example of such an embodiment is illustrated in FIG. 2B. In the example shown, two selectable logical data paths 206 208 are illustrated, namely Path A 206 and Path B 208. It is to be noted that Path A 206 and Path B 208 shown in FIG. 2B are logical data paths rather than physical paths, wherein each logical data path applies a certain processing logic to the data releases by the first clocked device 102. In addition, it is to be appreciated that, while Path A 206 and Path B 208 are independent logical data paths, they may in practical implementations share common circuit components As depicted in FIG. 2B, processing logic 106 further includes a logical data path selection module 256 responsive to a control signal 258 for selecting the desired logical data path, either Path A 206 or Path B 208 in the figure. In the specific example depicted, the logical data path selection module 256 includes a multiplexor.

As will be appreciated by the person skilled in the art, by associating control (selection) signal 258 to an external input and by making this input controllable through a suitable interface, the effective processing applied to the data released by the first clocked device may be based on any suitable criteria, such as a processor instruction, a signal generated by the first clocked device 102 or some other circuitry.

In the configuration shown in FIG. 2B, each logical data path 206 208 has a respective slow and fast data sub-paths.

In such a variant, the data propagation delay of data path 108 is the time taken for all the data propagating along the logical data path selected by the data path selection module 256. As such the data propagation delay of data path 108 corresponds to the sub-path propagation delay associated with the slow data-path of the selected logical data path (either Path A 206 or Path B 208 in the figure).

It will be appreciated that, although the examples in FIG. 2B has illustrated two logical data paths 206 208, this illustration was presented for the purpose of simplicity and practical implementations of processing logic 106 may include many more logical data paths without detracting from the spirit of the invention.

Clock Propagation Path 112

The clock propagation path 112 is for propagating clock signals 114 116 to the first clocked device 102 and the second clocked device 104.

The clock signal 114 propagated to the first clocked device 102 is generated by a component external to the circuit segment 100 shown in FIG. 1. The specific manner in which the clock signal 114 is generated may vary from one implementation to the other and is not critical to the understanding of the present invention. As such, the manner in which the clock signal 114 is generated will not be described in further detail here.

In the example depicted, the clock signal 116 propagated to the second clocked device 104 is a delayed version of clock signal 114. In this regard, the clock propagation path 112 includes clock delay logic 110 which receives the clock signal 114 and delays it by a clock delay interval.

The clock delay interval applied by the clock delay logic 110 is selected so that data released by the first clocked device 102 has sufficient time to propagate through data path 108 and reach the second clocked device 104 before the second clocked device reads the data arriving on the data path. As such the clock delay interval is related to the propagation delay of data path 108. The propagation delay of data path 108 may be determined using any suitable approach known in the art of circuit design.

In a specific example of implementation, the clock delay interval is selected to be at least as long as the propagation delay of data path 108. Mathematically, this may be expressed as follows:

$$\text{DEL\_A} \geq \text{propagation delay of data path 108} \quad (1)$$

Where DEL_A is the clock delay interval applied by the clock delay logic 110.

In another specific example of implementation, the clock delay interval is selected to be at least as long as the propagation delay of data path 108 and also takes into account a skew factor associated with the propagation of the clock over the clock propagation path 112. Mathematically, this may be expressed as follows:

$$\text{DEL\_A} \geq \text{propagation delay of data path 108} + \text{Clock Skew factor} \quad (2)$$

where the "Clock Skew factor" may be selected in accordance with any suitable known method.

The clock delay logic 110 may make use of any suitable circuit components for delaying a signal by a certain desired time period. Such circuit components are well known in the art of circuit design.

Figure 5A:
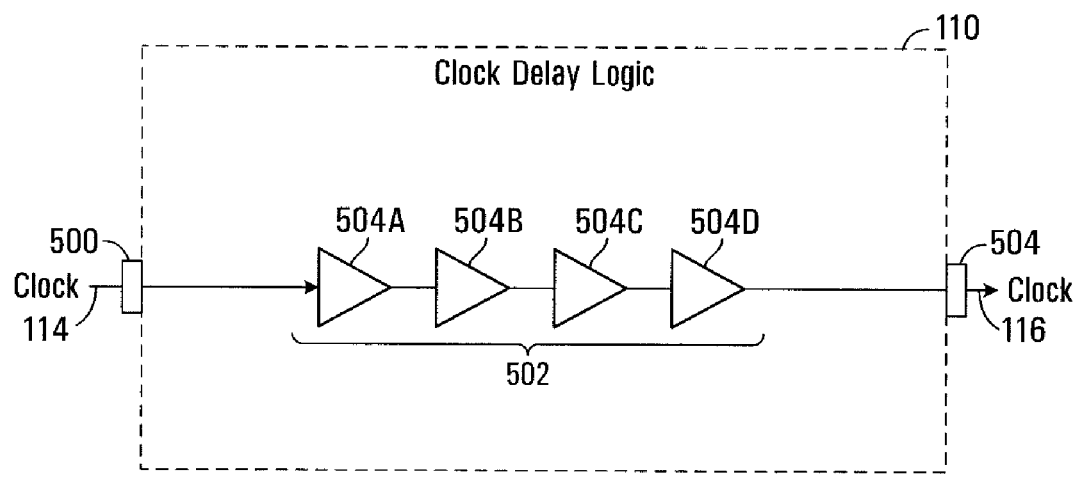
FIG. 5A shows a block diagram of clock delay logic in accordance with a specific example of implementation of the invention.

A first specific example of implementation of the clock delay logic 110 is shown in FIG. 5A of the drawings. As depicted, the clock delay logic 110 includes an input 500 for receiving the first clock signal 114, a delay circuit 502 for delaying the first clock signal 114 by a clock delay interval to obtain a delayed version of the first clock signal 114. The clock delay logic 110 also includes an output 504 for releasing the delayed version of the first clock signal as the second clock signal 116. The delay circuit 502 includes a series of delay elements 504A-D for implementing a desired delay interval.

As will be appreciated by the person skilled in the art, the precise propagation delays in circuit segment 100 (shown in FIG. 1) may be affected by a plurality of factors, all of which may be not be accurately modelled by common circuit design tools. For example, although the selection of "DEL_A" in equation (2) above provides for the used of a skew factor for the clock, current design tools for integrated circuits may not accurately model the phenomenon of clock skew since the latter is due in part to the physical properties of the material with which the integrated circuit is built. Moreover, the physical properties of the material may vary from one integrated circuit to the other, which may affect the propagation delays of the signals in the circuit segment 100.

In order to more specifically account for possible variations in the propagation delays, in a variant of the invention, the clock delay logic 110 makes the clock propagation delay a selectable parameter.

Figure 5B:
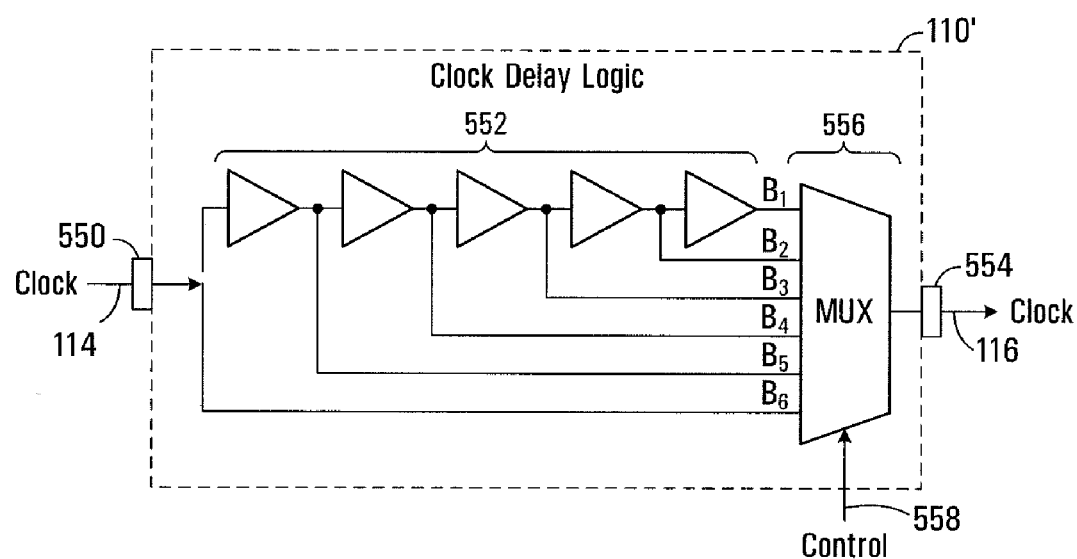
FIG. 5B shows a block diagram of clock delay logic in accordance with a variant of the invention.

A specific example of implementation of the clock delay logic 110 in accordance with such a variant is shown in FIG. 5B of the drawings and is referred to as clock delay logic 110'. As depicted, the clock delay logic 110' includes an input 550 for receiving the first clock signal 114, a delay circuit 552 for generating a plurality of delayed versions of the first clock signal 114, where each delayed version is associated with a respective clock delay interval in a set of possible clock delay intervals. The delayed versions of the first clock signal 114 are designated as signals $B_1, B_2, \ldots, B_6$ in FIG. 5B. The clock delay logic 110' also includes a clock delay interval selection module 556 responsive to a control signal 558 for selecting a delayed version of the first clock signal amongst the plurality of delayed versions of the first clock signal. The clock delay logic also includes an output 554 for releasing the selected delayed version of the first clock signal as the second clock signal 116.

Figure 6:
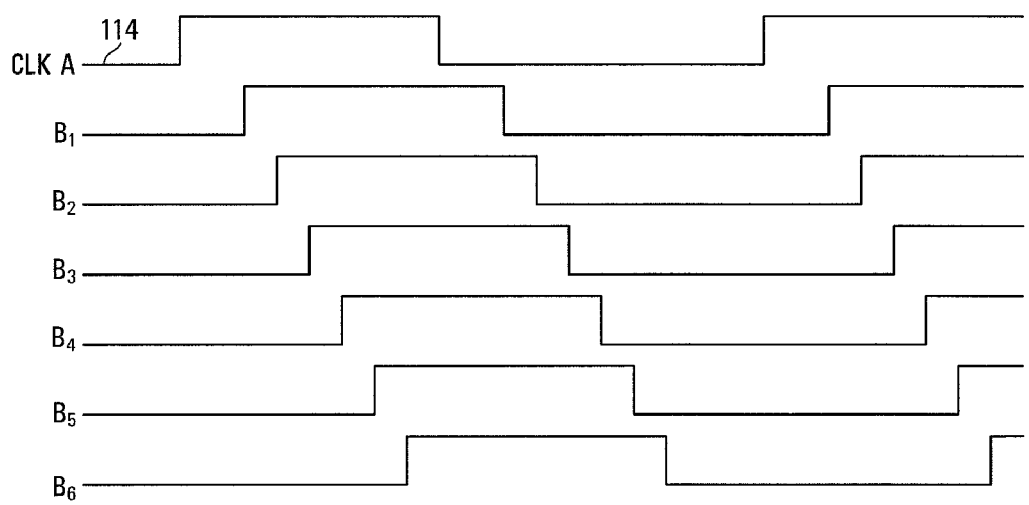
FIG. 6 shows timing diagrams showing different delayed versions of the clock signals being generated by the clock delay logic shown in FIG. 5B.

FIG. 6 of the drawings illustrates by means of a timing diagram different delayed versions of clock signal 114 being generated by the clock delay logic shown in FIG. 5B.

In the specific example depicted, the clock delay interval selection module 556 includes a multiplexor for selecting a delayed version of the first clock signal 114 amongst the plurality of delayed versions of the first clock signal 114.

As will be appreciated by the person skilled in the art, by associating control signal 558 to an external input and by making this input controllable through a suitable interface, the delay interval may be modified at different stages of the design and implementation of a circuit incorporating the circuit segment 100 (shown in FIG. 1) such as:

during the design of the circuit incorporating the circuit segment 100;

during the manufacturing of the circuit incorporating the circuit segment 100;

post-fabrication of the circuit incorporating the circuit segment 100.

It is to be appreciated by the person skilled in the art that the embodiment depicted in FIG. 5B is but one of many possible implementations of a circuit for deriving a clock delay interval and that many variants may be contemplated without detracting from the spirit of the invention.

Optionally, in implementations in which the data path 108 includes multiple selectable logical data paths between the first clocked device and the second clocked device, as shown in FIG. 2B, control signal 558 may be derived in part based on the control (selection) signal 258 (shown in FIG. 2B) used to select one of the logical data paths. As will be appreciated by the person skilled in the art, by deriving control signal 558 in part based on the control (selection) signal 258, the clock delay interval used can be influenced by the propagation delay of the logical data path selected. As mentioned above, the selected logical data path may vary from one clock event to the next.

Figure 5C:
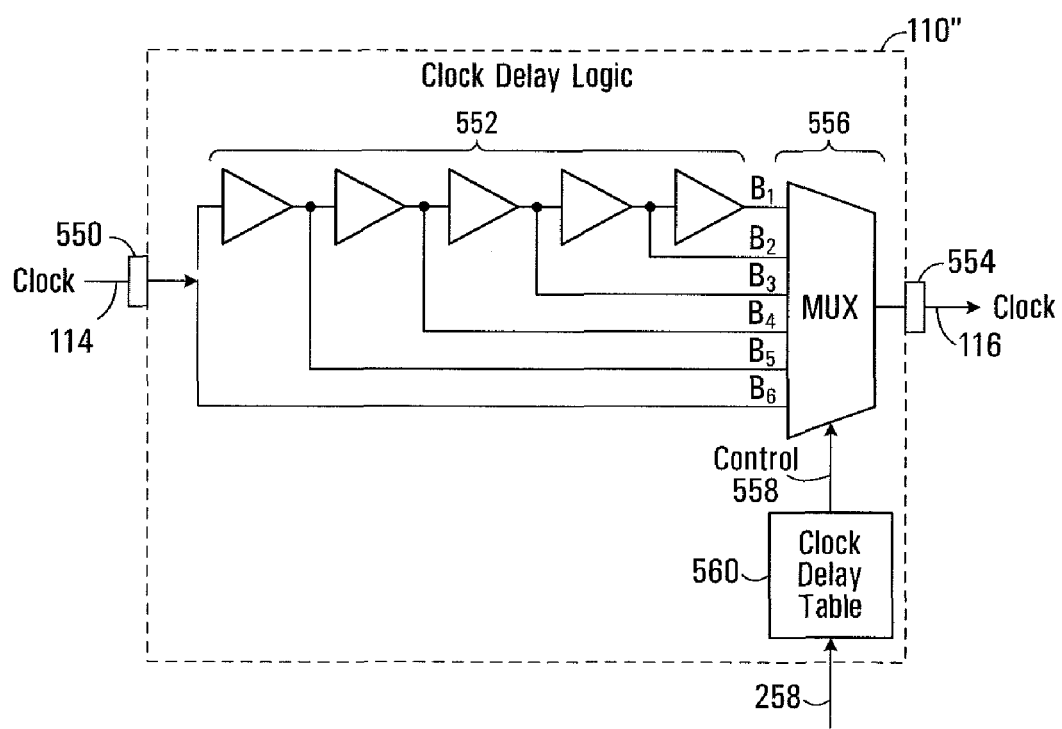
FIG. 5C shows a block diagram of clock delay logic in accordance with another variant of the invention.

A specific example of implementation of the clock delay logic 110 in accordance with such a variant is shown in FIG. 5C of the drawings and is referred to as clock delay logic 110". As was the case for clock delay logic 110' depicted in FIG. 5B, the clock delay logic 110" includes an input 550 for receiving the first clock signal 114, a delay circuit 552 for generating a plurality of delayed versions of the first clock signal 114, a clock delay interval selection module 556 responsive to a control signal 558 for selecting a delayed version of the first clock signal amongst the plurality of delayed versions of the first clock signal. The clock delay logic also includes an output 554 for releasing the selected delayed version of the first clock signal as the second clock signal 116.

In accordance with this variant, the control signal 558 is derived in part based on control (selection) signal 258, which was used to selected one of the logical data paths 206 208 shown in FIG. 2B. In the specific embodiment depicted, the clock delay selection signal 558 is selected from a clock delay table 560 by control (selection) signal 258.

As will be appreciated by the person skilled in the art, by making the entries in the clock delay table 560 programmable, the values contained in such a clock delay table 560 may be established at different stages of the design and implementation of a circuit incorporating the circuit segment 100 (shown in FIG. 1) such as:

during the design of a circuit using incorporating the circuit segment 100;

during the manufacturing of a circuit incorporating using the circuit segment 100;

post-fabrication of a circuit incorporating using the circuit segment 100.

It is to be appreciated by the person skilled in the art that the embodiment depicted in FIG. 5C is but one of many possible implementations in which control signal 558 is derived at east in part based on the control (selection) signal 258 and that other variants may be contemplated without detracting from the spirit of the invention.

Returning now to FIG. 1, the clock signal 114 includes a series of clock events (rising edges, falling edges or both) to which the first clocked device 102 is responsive for altering its state. The clock events may occur at a uniform frequency or, alternatively, may occur at variable frequencies.

In a first specific example of implementation, the time interval between consecutive clock events (rising edges, falling edges or both) to which the first clocked device 102 is responsive is set so that the data released by the first clocked device 102 arrives at and is sampled by the second clocked device 104 before new data is released by the first clocked device for propagation over data path 108. Mathematically, this may be expressed as follows:

Time interval between clock events $\geq$ DEL_A

Where DEL_A is the clock delay interval applied by the clock delay logic 110 and where DEL_A satisfies either one of mathematical relationships (1) or (2) presented above and reproduced below for the reader's ease of reference:

DEL_A $\geq$ propagation delay of data path 108     (1)

DEL_A $\geq$ propagation delay of data path 108+Clock Skew factor     (2)

It will also be appreciated that, in practical implementations, non-zero skews associated with the data path 108 and clock propagation path 112 may be taken into account in setting the time interval between consecutive clock events. Mathematically, this may be expressed as follows:

Time interval between clock events $\geq$ DEL_A+skew factor(clock delay logic 110)+skew factor(data path 108)

In a second specific example of implementation, the time interval between consecutive clock events (rising edges, falling edges or both) to which the first clocked device 102 is responsive is set so that data is released by the first clocked device 102 while previously released data is propagating through data path 108. As will be observed by the person skilled in the art, new data may be released by the first clocked device 102 while previously released data is propagating through data path 108 without any of the data being corrupted, provided that the second clocked device 104 reads the previously released data before the new data arrives at the second clocked device. As such, it is possible for the clock period used for clock signal 114 to be set to be smaller than the clock delay time interval (DEL_A).

In particular, in implementations where the data path 108 includes multiple sub-paths, the time interval between consecutive clock events should allow for sufficient time for the second clocked device 104 to read previously released data before the new data arrives at the second clocked device 104. Since the propagation delay may vary between sub-paths, the time interval between consecutive clock events should allow previous data propagating on the fastest sub-path to be sampled by the second clocked device 104 before newly released data propagating on the fastest sub-path arrives at the second clocked device 104.

In a specific example of implementation, the time interval between consecutive clock events is set so that it is no shorter than the difference between the clock delay interval applied by the clock delay logic 110 and the fast sub-path propagation delay. Optionally, in practical implementations, non-zero skews associated with the data path 108 and clock propagation path 112 may be taken into account in the time interval between consecutive clock events. Mathematically, this may be expressed as follows:

Time interval between clock events $\geq$ DEL_A−(fast sub-path propagation delay)+skew factor(clock delay logic 110)+skew factor(data path 108)

where skew factor(clock delay logic 110) and skew factor (data path 108) may be computed in accordance with any suitable method.

As will be appreciated by the person skilled in the art, in implementations where the data path 108 includes a single data sub-path, the time interval between consecutive clock events may be set to the difference between the clock delay interval applied by the clock delay logic 110 and the propagation delay of data path 108. Optionally, in practical implementations, non-zero skews associated with the data path 108 and clock propagation path may be taken into account in the time interval between consecutive clock events. Mathematically, this may be expressed as follows:

$$\text{Time interval between clock events} \geq \text{DEL\_A} - (\text{path propagation delay of 108}) \text{skew factor}(\text{clock delay logic 110}) + \text{skew factor}(\text{data path 108})$$

It is to be observed that, in practical physical implementations of the circuit segment depicted in FIG. 1, the clock propagation path 112 and the data path 108 will be in physical proximity to one another and will experience similar environmental conditions (e.g. material, temperature etc. . . . ). As such, the amount of delay that needs to be added to account for these environmental variations is typically less than the amount of delay that must be added to account for such variations when the clock signal is centrally generated and distributed.

Exemplary Circuit

A plurality of circuit segments of the type depicted in FIG. 1 may be connected to one another to form a circuit implementing a desired function. The clock delay logic for each circuit segment may be designed independently from that of other circuit segments in accordance with the description set forth with reference to FIGS. 1, 2, 2B, 5A, 5B, and 5C. When the circuit segments in the plurality of circuit segments are driven by a common clock, the time period between two consecutive clock events is at least as long as the longest time period between two consecutive clock events for all the circuit segments in the circuit.

Figure 3:
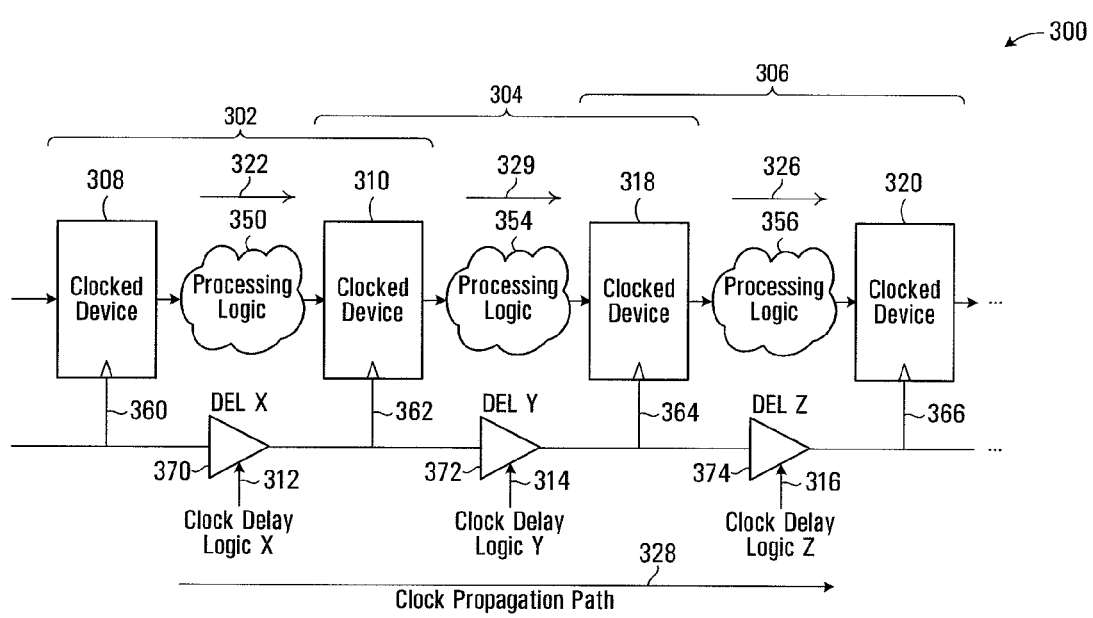
FIG. 3 shows a block diagram of a circuit including a plurality of circuit segments in accordance with a specific example of implementation of the present invention.

A portion of an exemplary circuit incorporating a plurality of circuit segments is shown in FIG. 3 of the drawings.

As depicted, the portion 300 of the exemplary circuit includes three (3) circuit segments 302 304 306 each having a configuration similar to that of circuit segment 100 shown in FIG. 1 of the drawings.

In the example depicted, circuit segment 302 includes clocked devices 308 and 310, a data path 322 between the clocked devices 308 and 310 and clock delay logic 370 on the portion of the clock propagation path 328 between the clocked devices 308 and 310. Similarly, circuit segment 304 includes clocked devices 310 and 318, a data path 329 between the clocked devices 310 and 318 and clock delay logic 372 on the portion of the clock propagation path 328 between the clocked devices 310 and 318. Similarly still circuit segment 306 includes clocked devices 318 and 320, a data path 326 between the clocked devices 318 and 320 and clock delay logic 374 on the portion of the clock propagation path 328 between the clocked devices 318 and 320.

Data paths 322, 329 and 326 are analogous to data path 108 described with reference to FIG. 1. Each of data paths 322, 329 and 326 includes respective processing logic 350 354 356 for processing data propagated over the data paths. Each one of data paths 322, 329 and 326 is associated with a respective propagation delay. Optionally, each one of data paths 322, 329 and 326 is also associated with a respective slow sub-path data propagation delay and fast sub-path data propagation delay.

Figure 4:
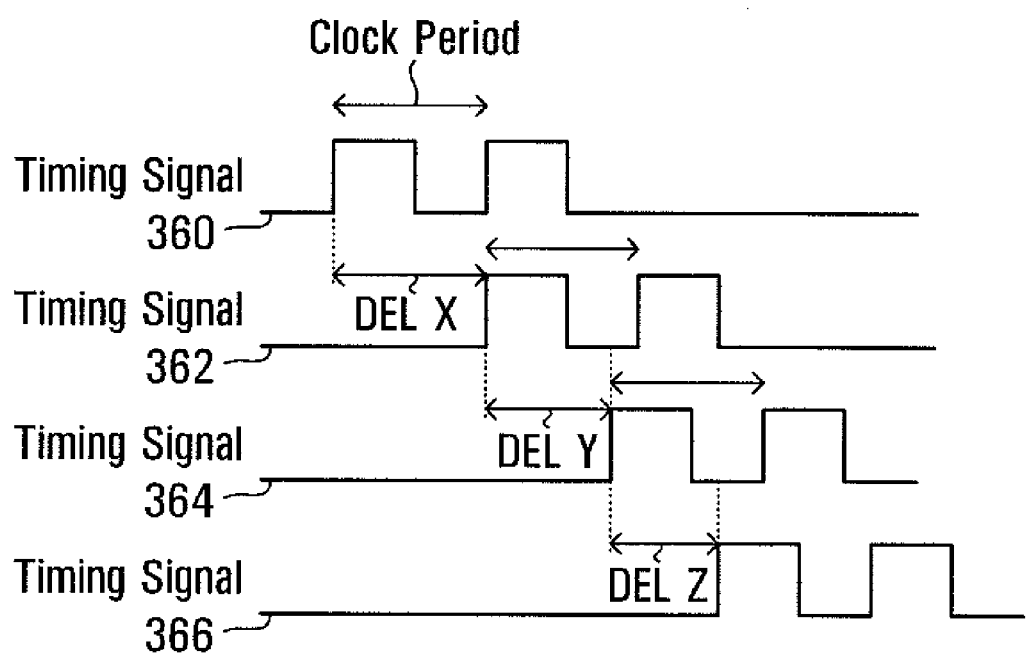
FIG. 4 shows a sample timing diagram showing different clock signals being propagated in the exemplary circuit shown in FIG. 3.

In the example depicted, the clock signal 366 propagated to clocked device 320 is a delayed version of clock signal 364 propagated to clocked device 318, which is a delayed version of clock signal 362 propagated to clocked device 310, which in turn is a delayed version of clock signal 360 propagated to clocked device 308. FIG. 4 shows an exemplary timing diagram for the clock signals 360 362 364 366.

As can be observed, the clocked devices 308 310 318 and 320 operate in accordance with respective clock signals that are offset from one another so that the change of state of these clocked devices 308 310 318 and 320 occurs at different times. As a result, such circuits would have fewer surges in power consumption (or surges of lesser magnitude) than conventional circuits where the components operate in accordance with a common global clock and change states at the same time.

Clock delay logic 370 372 and 374 in clock propagation path 238 are analogous to clock delay logic 110 and 110' described with reference to FIGS. 1, 5A and 5B.

Each one of clock delay logic 370 372 and 374 delays a clock signal that it receives by a respective clock delay interval related to a propagation delay of a corresponding one of the data paths 322 329 326. In a specific example of implementation, the clock delay interval is selected to be at least as long as the propagation delay of the corresponding data path. Mathematically, this may be expressed as follows:

$$\text{DEL\_X} \geq \text{propagation delay of data path 322} \quad (1)$$

$$\text{DEL\_Y} \geq \text{propagation delay of data path 329} \quad (2)$$

$$\text{DEL\_Z} \geq \text{propagation delay of data path 326} \quad (3)$$

Where DEL_X is the clock delay interval applied by the clock delay logic 370; DEL_Y is the clock delay interval applied by the clock delay logic 372 and DEL_Z is the clock delay interval applied by the clock delay logic 374.

In a manner similar to clock delay logic 110 and 110' described with reference to FIGS. 1, 5A and 5B the clock delay intervals applied by clock delay logic 370 372 and 374 may also take into account skew factors associated with the propagation of the clock over the clock propagation path 328.

In addition, in a manner similar to clock delay logic 110' described with reference to FIG. 5B, the clock delay logic may allow the respective clock delay intervals applied by clock delay logic 370 372 and 374 to be independently selectable parameters by providing suitable circuitry to that effect.

In a specific example of implementation, each one of clock delay logic component 370 372 and 374 is associated to a respective control signal 312 314 and 316 analogous to control signal 558 described with reference to clock delay logic 110' (shown in FIG. 5B). As will be appreciated by the person skilled in the art, by associating control signals 312 314 and 316 to inputs external to the circuit, and by making these inputs controllable through a suitable circuit interface, the delay intervals for each one of circuit segments 302 304 and 306 may be modified at different stages of the design and implementation of the circuit such as:

during the design of the circuit;
during the manufacturing of the circuit;
post-fabrication of the circuit.

As will be observed with reference to FIG. 3, clocked devices 308 310 318 and 320 are driven by respective clock signals originating from a common clock signal propagating over the clock propagation path 328. This clock signal includes a series of clock events (rising edges, falling edges or both) to which the clocked devices are responsive for altering their respective states. The clock events may occur at a uniform frequency or, alternatively, may occur at variable frequencies.

In order to avoid the loss of data, the time between consecutive events in the clock signals takes the data propagation delays of data paths 322 329 and 326, and optionally, the clock delay intervals applied by clock delay logic 370, 372, and 374, into account.

In a first non-limiting example of implementation, the time interval between consecutive clock events (rising edges, falling edges or both) is set so that the data released by any one of clocked devices 308 310 318 arrives at and is sampled by another clocked device before new data is released. Mathematically, this may be expressed as follows:

Time interval between clock events≧MAXIMUM{DEL_X; DEL_Y; DEL_Z}

It will also be appreciated that, in practical implementations, non-zero skews associated with the data paths 322 329 326 and clock propagation path 328 may be taken into account in the time interval between consecutive clock events.

In a second non-limiting example of implementation, the time interval between consecutive clock events is set so that data is released by any one of clocked devices 308 310 318 while previously released data is propagating through at least one of data paths 322 329 326.

In a specific example of implementation, the time interval between consecutive clock events is set so that it is at least as long as the longest one of the time intervals between consecutive clock events that are associated with the individual circuit segments 302 304 306. Mathematically, this may be expressed as follows:

---

Time interval between clock events for 302 ≧
    DEL_X - (fast sub-path propagation delay for 350) +
    skew factor(clock delay logic 370) +
    skew factor(data path 322)
Time interval between clock events for 304 ≧
    DEL_Y - (fast sub-path propagation delay for 354) +
    skew factor(clock delay logic 372) +
    skew factor(data path 329)
Time interval between clock events for 306 ≧
    DEL_Z - (fast sub-path propagation delay for 356) +
    skew factor(clock delay logic 374) +
    skew factor(data path 326)
TIME INTERVAL BETWEEN CLOCK EVENTS FOR COMBINED CIRCUIT ≧
    MAXIMUM {Time interval between clock events for 302;
    Time interval between clock events for 304;
    Time interval between clock events for 306}

---

It will be appreciated that although the example shown in FIG. 3 includes only three (3) circuit segments, a practical circuit may include several thousands of such circuit segments in order to implement a desired function. In such implementations, the time interval between clock events would be at least as long as the longest of the time intervals between consecutive events that are associated with the individual circuit segments in the circuit.

Those skilled in the art should appreciate that in some embodiments, all or part of the circuit 300 shown in FIG. 3 may be implemented in an IC, ASIC, FPGA or any other suitable type of circuit.

Although the present invention has been described in considerable detail with reference to certain preferred embodiments thereof, variations and refinements are possible. Therefore, the scope of the invention should be limited only by the appended claims and their equivalents.

The invention claimed is:

1. A circuit segment comprising:
   a) a first clocked device;
   b) a second clocked device;
   c) a data path between the first clocked device and the second clocked device for propagating data released by the first clocked device to the second clocked device, said data path having:
      i. a plurality of logical data paths between the first clocked device and the second clocked device, each of said logical data paths being associated with a respective logical path data propagation delay;
      ii. a logical data path selection module for selecting a logical data path amongst said plurality of logical data paths at least in part based on a logical data path selection control signal, data on the selected logical data path being propagated to the second clocked device;
   d) a clock propagation path for propagating clock signals to the first clocked device and the second clocked device, wherein the clock signal propagated to the second clocked device is delayed from the clock signal propagated to the first clocked device by a clock delay interval, the clock delay interval being derived at least in part based on the logical data path selection control signal so that the clock delay interval is related to the selected logical data path.

2. A circuit segment as defined in claim 1, wherein the clock delay interval is at least as long as the data propagation delay of the selected logical data path.

3. As circuit segment as defined in claim 2, wherein the clock delay interval is at least as long as a combined duration of the data propagation delay of the selected logical data path and a skew factor associated with the clock propagation path.

4. A circuit segment as defined in claim 1, wherein the clock signal propagated to the first clocked device is a first clock signal and the clock signal propagated to the second clocked device is a second clock signal, said clock propagation path including clock delay logic for delaying the first clock signal by the clock delay interval in order to obtain the second clock signal.

5. A circuit segment as defined in claim 4, wherein said clock delay logic includes:
   a) an input for receiving the first clock signal;
   b) a delay circuit for delaying the first clock signal by the clock delay interval to obtain a delayed version of the first clock signal;
   c) an output for releasing the delayed version of the first clock signal as the second clock signal.

6. A circuit as defined in claim 1, wherein the clock signal propagated to the first clocked device is a first clock signal and the clock signal propagated to the second clocked device is a second clock signal, said clock propagation path including clock delay logic for delaying the first clock signal by the clock delay interval in order to obtain the second clock signal, said clock delay logic including:
   a) an input for receiving the first clock signal;
   b) a delay circuit for generating a plurality of delayed versions of the first clock signal, each delayed version being associated with a respective clock delay interval in a set of possible clock delay intervals;
   c) a clock delay interval selection module responsive to the logical data path selection control signal for selecting a delayed version of the first clock signal amongst the plurality of delayed versions of the first clock signal;

d) an output for releasing the delayed version of the first clock signal selected by the clock delay interval selection module as the second clock signal.

7. A circuit segment as defined in claim 6, wherein the clock delay interval selection module includes a multiplexer.

8. A circuit comprising a plurality of circuit segments as defined in claim 1, the circuit segments being associated with respective clock delay intervals, the clock delay intervals being independent from one another.

9. A circuit segment as defined in claim 1, wherein said data path includes:
a) a plurality of data sub-paths between the first clocked device and the second clocked device for propagating data released by the first clocked device to the second clocked device, each of said data sub-paths being associated with a respective sub-path data propagation delay, said plurality of data sub-paths including:
   i. a slow data sub-path associated with a slow sub-path data propagation delay;
   ii. a fast data sub-path associated with a fast sub-path data propagation delay;
b) wherein the data path is associated with a data path propagation delay that corresponds to the slow sub-path propagation delay; and
c) wherein the clock signal propagated to the first clocked device includes a plurality of clock events and is characterized in that a time period between two consecutive clock events is conditioned at least in part based on the fast sub-path propagation delay.

10. A circuit segment as defined in claim 9, wherein the time period between the two consecutive clock events is at least as long as a difference between the clock delay interval and the fast sub-path propagation delay.

11. A circuit segment as defined in claim 9, wherein the time period between the two consecutive clock events is at least as long as a combined duration of:
a) a difference between the clock delay interval and the fast sub-path propagation delay; and
b) a skew factor associated with the data path.

12. A circuit segment as defined in claim 9, wherein the time period between the two consecutive clock events is at least as long as a combined duration of:
a) the difference between the clock delay interval and the fast sub-path propagation delay;
b) the skew factor associated with the data path; and
c) a skew factor associated with the clock delay logic.

13. A circuit segment comprising:
a) a first clocked device;
b) a second clocked device;
c) a data path between the first clocked device and the second clocked device for propagating data released by the first clocked device to the second clocked device, said data path having:
   i. a plurality of logical data paths between the first clocked device and the second clocked device, each of said logical data paths being associated with a respective logical path data propagation delay;
   ii. a logical data path selection module for selecting a logical data path amongst said plurality of logical data paths at least in part based on a logical data path selection control signal, data on the selected logical data path being propagated to the second clocked device;
d) a clock propagation path for propagating clock signals to the first clocked device and the second clocked device, wherein the clock signal propagated to the first clocked device is a first clock signal and the clock signal propagated to the second clocked device is a second clock signal, said clock propagation path including clock delay logic including:
   i. a delay circuit for generating a plurality of delayed versions of the first clock signal, each delayed version being associated with a respective clock delay interval in a set of possible clock delay intervals;
   ii. a clock delay interval selection module for selecting a delayed version of the first clock signal amongst the plurality of delayed versions of the first clock signal at least in part based on the logical data path selection control signal so that the clock delay interval is related to the selected logical data path;
   iii. an output for releasing the delayed version of the first clock signal selected by the clock delay interval selection module as the second clock signal.

14. A circuit segment as defined in claim 13, wherein the clock delay interval selection module includes a multiplexer.

15. A circuit segment as defined in claim 13, wherein the clocked devices include components selected from the set consisting of latches and flip-flops.

16. A circuit comprising a plurality of circuit segments as defined in claim 13, wherein clock signals are propagated to clocked devices in the circuit segments, the clock signals being characterized by a plurality of clock events, wherein a time period between two consecutive clock events in the clock signal is related to a clock delay interval associated with one circuit segment in the plurality of circuit segments.

17. A circuit comprising a plurality of circuit segments as defined in claim 13, the circuit segments being associated with respective clock delay intervals, the clock delay intervals being independent from one another.

18. A method for propagating clock signals in a circuit segment having a first clocked device, a second clocked device and a data path between the first clocked device and the second clocked device, the data path propagating data released by the first clocked device to the second clocked device, the data path having:
   i. a plurality of logical data paths between the first clocked device and the second clocked device, each of said logical data paths being associated with a respective logical path data propagation delay;
   ii. a logical data path selection module for selecting a logical data path amongst said plurality of logical data paths at least in part based on a logical data path selection control signal, data on the selected logical data path being propagated to the second clocked device;
said method comprising providing a clock propagation path for propagating clock signals to the first clocked device and to the second clocked device, wherein the clock signal propagated to the second clocked device is delayed from the clock signal propagated to the first clocked device by a clock delay interval, the clock delay interval being derived at least in part based on the logical data path selection control signal so that the clock delay interval is related to the selected logical data path.

19. A method as defined in claim 18, wherein the clock delay interval is at least as long as the data propagation delay of the selected logical data path.

20. A method as defined in claim 19, wherein the clock delay interval is at least as long as a combined duration of the data propagation delay of the selected logical data path and a skew factor associated with the clock propagation path.

21. A method as defined in claim 18, wherein the clock signal propagated to the first clocked device is a first clock signal and the clock signal propagated to the second clocked device is a second clock signal, said method including delaying the first clock signal by the clock delay interval in order to obtain the second clock signal.

22. A method as defined in claim 18, wherein the clock signal propagated to the first clocked device is a first clock signal and the clock signal propagated to the second clocked device is a second clock signal, said method comprising:
   a) receiving the first clock signal;
   b) generating a plurality of delayed versions of the first clock signal, each delayed version being associated with a respective clock delay interval in a set of possible clock delay intervals;
   c) using the logical data path selection control signal to select a delayed version of the first clock signal amongst the plurality of delayed versions of the first clock signal;
   d) releasing the delayed version of the first clock signal selected by the clock delay interval selection module as the second clock signal.

23. A method as defined in claim 18, wherein said data path includes:
   a) a plurality of data sub-paths between the first clocked device and the second clocked device for propagating data released by the first clocked device to the second clocked device, each of said data sub-paths being associated with a respective sub-path data propagation delay, said plurality of data sub-paths including:
      i. a slow data sub-path associated with a slow sub-path data propagation delay;
      ii. a fast data sub-path associated with a fast sub-path data propagation delay;
   b) wherein the data path is associated with a data path propagation delay that corresponds to the slow sub-path propagation delay; and
   c) wherein the clock signal propagated to the first clocked device is characterized in that a time period between two consecutive clock events is conditioned at least in part based on the fast sub-path propagation delay.

24. A method as defined in claim 23, wherein the time period between the two consecutive clock events is at least as long as a difference between the clock delay interval and the fast sub-path propagation delay.

25. A method as defined in claim 23, wherein the time period between the two consecutive clock events is at least as long as a combined duration of:
   a) a difference between the clock delay interval and the fast sub-path propagation delay; and
   b) a skew factor associated with the data path.

26. A method as defined in claim 23, wherein the time period between the two consecutive clock events is at least as long as a combined duration of:
   a) the difference between the clock delay interval and the fast sub-path propagation delay;
   b) the skew factor associated with the data path; and
   c) a skew factor associated with the clock delay logic.

27. A method for propagating clock signals in a circuit segment having a first clocked device, a second clocked device and a data path between the first clocked device and the second clocked device, the data path propagating data released by the first clocked device to the second clocked device, the data path having:
   i. a plurality of logical data paths between the first clocked device and the second clocked device, each of said logical data paths being associated with a respective logical path data propagation delay;
   ii. a logical data path selection module for selecting a logical data path amongst said plurality of logical data paths at least in part based on a logical data path selection control signal, data on the selected logical data path being propagated to the second clocked device;
said method comprising:
   a) providing a clock propagation path for propagating clock signals to the first clocked device and the second clocked device;
   b) propagating a first clock signal to the first clocked device along the clock propagation path;
   c) generating a plurality of delayed versions of the first clock signal, each delayed version being associated with a respective clock delay interval in a set of possible clock delay intervals;
   d) selecting as a second clock signal a delayed version of the first clock signal amongst the plurality of delayed versions of the first clock signal at least in part based on the logical data path selection control signal so that the clock delay interval is related to the selected logical data path;
   e) propagating the second clock signal to the second clocked device on the clock propagation path.

28. A method as defined in claim 27, wherein said data path includes:
   a) a plurality of data sub-paths between the first clocked device and the second clocked device for propagating data released by the first clocked device to the second clocked device, each of said data sub-paths being associated with a respective sub-path data propagation delay, said plurality of data sub-paths including:
      i. a slow data sub-path associated with a slow sub-path data propagation delay;
      ii. a fast data sub-path associated with a fast sub-path data propagation delay;
   b) wherein the data path is associated with a data path propagation delay that corresponds to the slow sub-path propagation delay; and
   c) wherein the clock signal propagated to the first clocked device is characterized in that a time period between two consecutive clock events is conditioned at least in part based on the fast sub-path propagation delay.

* * * * *